United States Patent [19]

Clarke et al.

[11] Patent Number: 4,869,930
[45] Date of Patent: Sep. 26, 1989

[54] METHOD FOR PREPARING SUBSTRATES FOR DEPOSITION OF METAL SEED FROM AN ORGANOMETALLIC VAPOR FOR SUBSEQUENT ELECTROLESS METALLIZATION

[75] Inventors: Thomas C. Clarke, Morgan Hill, Calif.; Caroline A. Kovac, Ridgefield, Conn.; Dae Y. Jung, Endwell, N.Y.; Jae M. Park, Mahopac, N.Y.; Richard R. Thomas, Fishkill, N.Y.

[73] Assignee: International Business Machines Corporation, Armonk, N.Y.

[21] Appl. No.: 218,416

[22] Filed: Jul. 12, 1988

Related U.S. Application Data

[63] Continuation of Ser. No. 72,203, Jul. 10, 1987, abandoned.

[51] Int. Cl.$^4$ .............................................. C23C 16/00
[52] U.S. Cl. ...................................... 427/252; 427/96; 427/99; 427/304; 427/305; 427/306; 427/404
[58] Field of Search .................... 427/96, 99, 304, 305, 427/306, 404, 252

[56] References Cited

U.S. PATENT DOCUMENTS

| | | | |
|---|---|---|---|
| 2,888,376 | 5/1959 | Drummond | 427/252 |
| 3,035,944 | 5/1962 | Sher et al. | 427/305 |
| 3,086,881 | 4/1963 | Jenkin | 427/252 |
| 3,188,230 | 6/1965 | Bakish et al. | 427/252 |
| 3,294,654 | 12/1966 | Norman et al. | 427/252 |
| 3,914,515 | 10/1975 | Kane et al. | 427/252 |
| 4,297,397 | 10/1981 | Feldstein | 427/306 |
| 4,325,991 | 4/1982 | Donovan et al. | 427/306 |
| 4,582,564 | 4/1986 | Shanefield et al. | 427/99 |
| 4,716,050 | 12/1987 | Green et al. | 427/404 |

OTHER PUBLICATIONS

"Metalizing Plastic Surfaces," by R. Ostwald and G. Voit, Chemical Abstracts, vol. 103, (1985), Abstract 103:55039v.

"Rendering Kapton or Other Polyimide Film Photo Sensitive to a Catalyst for the Deposition of Various Metals in Patterns," by A. Shirk and J. P. Redmond, Electric Phenomena, vol. 90, (1979), Abstract 90:79931u.

Primary Examiner—Stanley Silverman
Attorney, Agent, or Firm—Daniel P. Morris

[57] ABSTRACT

A process for preparing a substrate, e.g., an epoxy printed circuit board, for subsequent metallization. Active chemical sites are formed adhering to the substrate surface. The substrate is then exposed to a vapor of a volatile organometallic compound, which chemically reacts with the active sites and is decomposed to at least a species of the metal constituent of the compound. This species adheres to the substrate and can be transformed into the free metal which is useful as a seed for subsequent electroless deposition of a metal thereon. If selective deposition is desired, a resist masking layer is used prior to forming the seed layer. Volatile organopalladium compounds, such as (cyclopentadienyl)(allyl)palladium and bis(allyl)pallidium, are particularly effective for depositing a palladium seed which is particularly effective for electroless deposition of copper.

23 Claims, 2 Drawing Sheets

METHOD FOR PREPARING SUBSTRATES FOR DEPOSITION OF METAL SEED FROM AN ORGANOMETALLIC VAPOR FOR SUBSEQUENT ELECTROLESS METALLIZATION

This is a continuation of application Ser. No. 072,203 filed 7/10/87 now abandoned.

TECHNICAL FIELD

The present invention is a method for depositing a metallic seed layer from a vapor of an organometallic compound for use in the deposition of metals on a substrate, for example, in the manufacture of a printed circuit board. It is particularly useful for forming a palladium seed layer for the subsequent electroless deposition of copper.

DESCRIPTION OF THE PRIOR ART

It is well known in the art that certain metals act as seed material for electroless deposition of other metals. For example, palladium is a well known seed material for electroless copper deposition. Often metal patterns, for example conducting lines, are formed on printed circuit boards by depositing or forming a layer of such metal seed on the surface of the printed circuit board, followed by the electroless deposition of a metal forming the conductor onto the seed layer.

In the art, seed layers have been formed by wet or (liquid) or dry processes. In a wet process the surface to be plated is first sensitized. The sensitized surface is exposed to a liquid which contains a homogeneous distribution of a compound or complex of the seed metal. The compound reacts with the sensitized surface. The solvent is removed and the compound either physically adheres to the sensitized surface or a species of the constituent metal of the compound adheres to the surface. The compound adhering to the surface is then transformed to the free metal adhering to the surface. The free metal acts as a seed layer for subsequent electroless deposition of another metal. U.S. Pat. No. 4,493,861 to Sirinyan et al. describes such a wet process for forming a metal seed layer.

A dry process for depositing a metal seed layer is described in U.S. Pat. No. 4,574,095 to Baum et al. In this process a palladium seed layer is formed for the selective electroless deposition of copper. A substrate is contacted with a vapor of a palladium compound. The compound is selectively irradiated with light to cause selective deposition of seeds of palladium on the substrate. Copper is then electrolessly deposited onto the palladium seed. Palladium seed is selectively deposited onto the substrate by first depositing onto the substrate a resist-type material which is removed by irradiation with an excimer laser which also causes deposition of seeds of palladium onto the irradiated parts of the substrate. The resist not removed can be left as a permanent resist which acts as an insulator between the subsequently electrolessly deposited copper lines.

Both of the above approaches have problems. Wet processes require complex sequences of chemical steps designed to produce active metallic species on the surface of a substrate such as an epoxy/glass composite. These processes require repeated exposure of the substrate to aqueous solutions which exacerbate problems associated with moisture pickup in the epoxy. Moisture pickup in the epoxy causes plasticizing of the epoxy and generally lowers its glass transition temperature. Also, aqueous solutions generally contain ionic contaminants which are left on the substrate surface after processing with these solutions. Such ionic contamination reduces the resistivity of the epoxy surface and can result in unwanted leakage current paths between metal lines on the epoxy surface. Moreover, tese wet processes involve very sensitive chemistry and are prone to failure for reasons whose origin are often difficult to determine and correct. The dry process of the Baum et al. patent utilizes a laser technique which is complex to implement in a production line operation, as to do so would require a large expenditure for auxiliary equipment to step the laser beam across the printed circuit board in order to process metal lines. In contrast, the present invention is a dry process for substrate seeding that uses conventional type tooling and conventional type process steps, thus avoiding such complexity and cost.

In the present invention a substrate such as an epoxy useful as a printed circuit board is sensitized with chemically active sites which adhere to the substrate surface. The sensitized surface is contacted with a vapor of an organometallic compound. The compound chemically reacts with the active sites forming a species of the constituent metal of the compound which species adheres to the sensitized surface.

As used herein the species of the constituent metal of the compound means: (1) a chemical compound of the constituent metal; (2) the constituent metal in a nonzero oxidation state; or (3) the constituent metal in the zero oxidation state. For a metal to act as a seed for electroless deposition, it must be in the zero oxidation state, referred to herein as the free metal. Therefore, if the species of the constituent metal is a chemical compound of the constituent metal or is the consituent metal in a nonzero oxidation state, it must be transformed to the metal in the zero oxidation state which adheres to the substrate surface to act as a seed layer for subsequent electroless deposition.

It is acknowledged that the chemical reaction of organometallic compounds with chemically active sites, such as acids is commonly known in the art. See for example: Ward, M. D.; Schwartz, J., J. Am. Chem. Soc. 1981, pgs. 5253–5255; Huang, T. N.; Schwartz, J., J. Am. Chem. Soc. 1982 pgs. 3244–3245. It is also known in the art that some organometallic compounds are volatile. See for example: McClennan et al J. Am. Chem. Soc. 1961, pgs. 1601–1607.

In some applications it is desirable to form the seed material only on selected regions of the substrate and for this purpose a resist-type material is used as a mask. A metal will then be electrolessly deposited only in the seeded regions. Furthermore, it may also be desirable to leave the resist in the regions not seeded. Such a permanent resist can function as an insulator between the electrolessly deposited metal lines. A process using a permanent resist is generally less complex since it does not require steps to remove the resist, and is less costly. Also, with a permanent resist process defects associated with the process steps necessary to remove the resist are eliminated, resulting in an improved process yield. However, the prior art processes for forming seed layers lead to problems when a permanent resist is to be formed.

In general, seeding techniques for electroless plating of advanced circuit boards involve deposition of the seed material over the entire surface of the board prior to application of the resist. The resist is then imaged and developed to expose selected seed-covered substrate regions where circuitry is desired. The exposed seed regions allow electroless plating of the desired circuit pattern, but the unexposed seed beneath the resist must be removed since it is conducting, and will be a source of electrical leakage current between plated metal lines. Thus, this approach does not allow the resist-layer to be left as a permanent resist, i.e., as a dielectric layer in the finished board.

In contrast with the prior seeding techniques, the present invention can use a permanent resist and avoid the problem of leaving metal seed under the permanent resist. After a substrate is sensitized with active chemical sites a resist type material is deposited onto the sensitized surface and selectively removed. The substrate is then contacted with a vapor of an organometallic compound. A species of the constituent metal of the compound, the constituent metal in the zero oxidation state adheres to the sensitized surface where the resist has been removed. The constituent metal species is transformed to free metal. Another metal is electrolessly deposed only onto the regions of the substrate to which the seed adheres.

It is an object of the present invention to provide a method for deposition onto the substrate surface from a vapor of an organometallic compound a species of the constituent metal of the organometallic compound.

It is another object of the present invention to provide an improved method of seeding a substrate, especially a polymer or epoxy substrate.

It is another object of the present invention to provide a method for the selective seeding of a substrate surface by a dry process which avoids the problems associated with the wet processes of the prior art and which is less costly and complex than prior art dry processes.

It is another object of the present invention to provide a method for selective seeding of a substrate surface which permits the use of a permanent resist-type material without the problems associated with prior art methods that employ permanent resist layers.

It is another object of the present invention to provide an improved method of electroless deposition of a metal onto a substrate.

SUMMARY OF THE INVENTION

The method of the present invention, in its broadest aspect, comprises the steps of forming active chemical sites adhering to a substrate surface and chemically reacting with these sites volatile organometallic compounds. The substrate with chemically active sites is exposed to a vapor of the volatile organometallic compound for a time long enough for the organometallic compound to decompose into a species of its constituent metal by reacting with the chemically active site. Since the chemically active sites adhere to the substrate surface, the chemical species of the constituent metal also adheres to the substrate surface.

As used herein, the species of the constituent metal of the compound means: (1) a chemical compound of the constituent metal; (2) the constituent metal in a nonzero oxidation state; or (3) the constituent metal in the zero oxidation state.

In accordance with a more particular aspect of the present invention, the metallic chemical species, if not the zero oxidation state of the constituent metal, is then transformed into the zero oxidation state of the constituent metal which is bound to the substrate surface. Such a transformation can be accomplished by thermal decomposition, by chemical reduction, by exposing the substrate to atmospheric oxygen, and by exposure of a heated substrate to atmospheric oxygen. The zero oxidation state metal constituent adhering to the substrate surface is useful as a seed layer for electorless deposition by conventional means of the same metal or another metal.

In accordance with another more particular aspect of the invention, after the chemically active sites have been formed on the substrate surface, a resist-type material such as a photoresist can be deposited on the substrate and patterned to expose these sites in selected locations. The substrate is then exposed to the vapor of the organometallic compound which selectively reacts with the exposed chemically active sites on the substrate surface. In these regions the organometallic compound decomposes to a species of the constituent metal which is then transformed into the constituent metal that can act as selective seed layer for electrolessly depositing the same or another metal.

Palladium is a particularly effective seed metal for electroless deposition of metals, especially copper. Particularly useful volatile organometallic compounds to practice the described invention are organopalladium compounds of which (cylopentadienyl)(allyl)palladium(II) and derivatives thereof and bis(allyl)palladium and derivatives thereof are examples.

DETAILED DESCRIPTION OF THE PREFERRED EMBODIMENTS OF THE INVENTION

Figure 1:
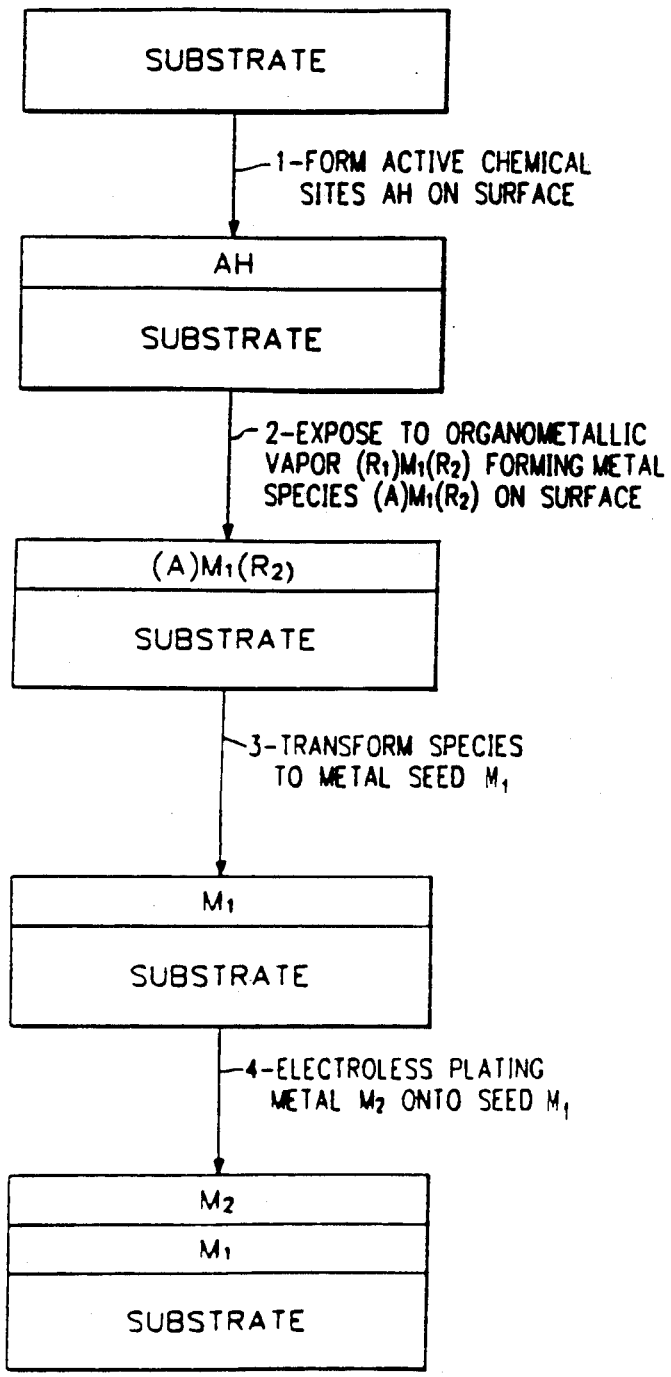
FIG. 1 is a flow chart diagrammatically outlining the principal method steps for sensitizing and metallizing a substrate.

For convenience, the invention will be described in terms of preparing a printed circuit board for electroless deposition of copper onto a selectively deposited palladium seed layer. However, it should be understood that the invention extends to other materials and to many uses other than printed circuit boards. In general, the invention is suitable for any use wherein an electrolessly deposited adherent metal coating is applied to suitable substrate such as a polymer i.e., an epoxy, a semiconductor, a ceramic or silica gel.

In the practice of this invention it is necessary to provide chemically active sites on a substrate which is then exposed to a vapor of an organometallic compound. These sites must react with the organometallic compound vapor to decompose it, at least, to a species of the metal constituent of the compound. This species must in turn be capable of being transformed to a zero oxidation state of the constituent metal or this species must be the zero oxidation state of the constituent metal. For the purposes of this invention, these sites are any type of localized regions of the substrate, or an entire surface of the substrate which will react with the organometallic compound vapor to cause the desired reaction. Examples of suitable chemically active sites are acid functionals and ammonia functionals.

The following will describe a known way for obtaining chemically active sites on a epoxy of the type used as a printed circuit board. These boards often have a copper cladding layer on at least one surface. This cladding layer is referred to as a sacrificial copper foil. Such a foil-clad substrate is manufactured by Gould Inc. of Mentor, Ohio and is marketed as Gould TC FOIL. One side of the sacrificial copper foil is smooth while the other side, which adheres to the substrate surface, has a rough texture. The rough side of the copper foil is usually coated with a material which promotes adhesion to the epoxy, for example chromate compounds. The rough side of the copper foil is laminated with the epoxy imparting to the epoxy a roughened surface. After subsequent etching of the copper foil the roughened epoxy surface provides the surface topography necessary for a subsequent electrolessly deposited metal, such as copper, to firmly adhere to the substrate. The sacrificial copper foil is etched away by chemicals such as cupric chloride, $CuCl_2$, and ferric chloride, $FeCl_3$. These chemical etchants do not remove the chrome compounds from the epoxy surface. Approximately 17% of the epoxy surface is covered with chromic acids of a general formula known in the $H_xCrO_y$, where x and may have varying values depending on the valence state of the chrome ion. These chrome compounds are acidic and serve as active chemical sites on the epoxy surface.

In the present invention organometallic compounds which sublimate to the vapor phase can be used to provide the vapor which reacts with the chemically active sites on the epoxy substrate surface. A suitable apparatus and technique for doing this will now be described.

The substrate with the active chemical sites is placed in a chamber such as a glass jar or stainless steel jar which has a means to evacuate the chamber. The pressure in the chamber is lowered below atmospheric pressure for easy sublimation of the organometallic compounds. It has been found that 0.01 torr is satisfactory. This value is exemplary only and is not limiting. The organometallic compound is held in solid form in another isolated chamber which is connected to the chamber containing the substrate. When the chamber containing the organometallic compound is opened up to the substrate-containing chamber, it becomes filled with the organometallic vapor. The vapor contacting the substrate reacts with the chemically active sites.

The preferred embodiment of this invention uses volatile organopalladiium compounds to cause palladium metal to be deposited on the substrate as a seed for subsequent electroless depositon of copper onto the seed. It is, of course, understood that the use of organopalladium compounds is only exemplary and is not limiting. Other organometallic compounds of which the metal constituent is an effective seed material can be used. It has been found that the substrate need be exposed to the vapor for only about 5–10 seconds to get a seed layer sufficient for in effective subsequent electroless deposition of copper. These times are exemplary and not limiting.

The preferred organopalladium compounds are (cyclopentadienyl)(allyl) palladium(II) represented by the chemical formula $(C_5H_5)Pd(C_3H_5)$ and bis(allyl)palladium(II), represented by the chemical formula $(C_3H_5)Pd(C_3H_5)$. Both of these compounds are volatile. Volatile derivatives of these compounds are also suitable. In derivatives of these compounds, all or any combinations of the hydrogen atoms of the two organic ligands—the allyl groups and the cyclopentadienyl groups—are substituted for by any organic or inorganic substituents. It is only necessary that the compounds sublimate to a vapor.

An organometallic compound useful for forming a seed layer for electroless deposition of a metal by the method of this invention must be volatile and the constituent metal must be active seed for the metal which is electrolessly deposited. Nickel, copper and palladium are active seed metals for electroless deposition of a metal such as copper.

Nickel carbonyl and diallylnickel(II) are examples of volatile organonickel compound useful for practicing this invention to deposit nickel seed. Nickel carbonyl is represented by the chemical formula $Ni(CO)_4$. Diallylnickel(II) is represented by the chemical formula $(\eta^3-C_3H_5)_2Ni(II)$. A volatile organocopper compound useful for practicing this invention is copper(cyclopentadienyl)triethylphosphine)(I) which is represented by the chemical formula $(\eta^5-C_5H_5)(P\{C_2H_5\}_3)Cu(I)$. The term $\eta^x$ indicates that x carbon atoms of the organic ligand are bound to the metal. These compounds and volatile derivatives thereof, formed by substituting all or any combination of hydrogen atoms with any organic or inorganic substituents, chemically react in a similar fashion to the organopalladium compounds referred to hereinabove.

The deposition of palladium metal from an organopalladium compound is easily effected due to the inherently weak nature of the bond between palladium and the organic ligands. This bond is weak enough to be broken in a variety of fashions. For instance, organopalladium compounds can be easily decomposed into another species by reaction with and acidic material. This usually results in the formation of a saturated organic ligand and a metal salt which adheres to the surface either chemically, physically, or by other means. Complete reduction of the metal does not always occur with this type of reaction. In this case, the reaction is useful to anchor a metal salt to suitably treated surfaces. A subsequent process step is used to reduce the metal salt to the metal constituent which adheres either chemically, physically, or by other ways to the surface. This metal is an effective seed layer for a subsequent electroless deposition of another metal such as copper, cobalt, palladium, nickel, silver, or gold. The preferred metal for a printed circuit board is copper.

The preferred palladium compounds (cyclopentadienyl)(allyl)palladium (II) and bis(allyl)palladium(II) possess the organic ligands needed for decomposition and appreciable volatility as well.

It is not necessary to start with copper clad epoxy to form acid functionals on the substrate surface. Acid functionals can be formed on an epoxy surface by treating this surface with an oxidizing solution such as chromic acid. This results in chromic acid either chemically or physically adhering to the epoxy surface or the formation of organic acids at the surface by the oxidation of the epoxy.

Known organometallic chemistry is represented by the following chemical reactions where M represents the metal species, L represents an organic ligand, n is the number of organic ligands, x is an element from the group fluorine, chlorine, bromine and iodine, $RCO_2H$ represents an organic acid and Si-OH represents silica gel:

$$ML_n + HX \rightarrow ML_{n-1}X + LH$$

$$ML_n + RCO_2H \rightarrow ML_{n-1}(RCO_2) + LH$$

$$ML_n + Si-OH \rightarrow M(SiO)(L_{n-1}) + LH$$

FIG. 1 diagrammatically outlines the principal method steps for sensitizing and metallizing a substrate. In step 1 active chemical sites are formed on the substrate surface. The active chemical site is represented in FIG. 1 as AH, where H is a hydrogen atom and A is a chemical consituent of the chemical site which adheres to the substrate surface. In step 2 the sensitized substrate is exposed to a vapor of an organometallic compound represented by $(R_1)M_1(R_2)$ where $R_1$ and $R_2$ are organic ligands and $M_1$ is the consituent metal. The chemically active site AH chemically reacts with the vapor $(R_1)M_1(R_2)$ to form a species of the organometallic compound referred to herein as a species of the constituent metal which is represented by $AM_1(R_2)$. This species adheres to the substrate surface. A saturated organic ligand represented by $R_1H$ is a second product of the chemical reaction. In step 3, the species of the constituent metal is transformed to the zero oxidation state of the constituent metal which also adheres to the substrate surface. The layer $M_1$ acts as a catalytic seed for electroless plating (Step 4) of another metal $M_2$ onto the seed layer $M_1$.

If the substrate surface sensitized with chromic acid is exposed to (cyclopentadienyl)(allyl)palladium it is believed that one or both of the following chemical reactions occurs:

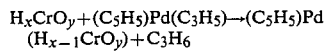

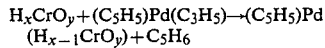

The palladium salt reaction product adheres to the substrate surface. The allyl ligand is protonated to propylene or the cyclopentadienyl ligand is protonated to cyclopentadiene.

If the substrate is exposed to a vapor of bis(allyl)palladium, the chemical reaction is the same except that the cyclopentadienyl ligand is replaced by an allyl ligand. The salt of the organopalladium compound adheres to the substrate surface since the $H_{x-1}CrO_y$ constituent adheres to the surface.

The organopalladium salt is transformed into palladium metal of the zero oxidation state which is the correct oxidation state for the palladium to act as a catalytic seed for the electroless deposition of a metal such as copper. This transformation can occur by chemical reduction, by thermal decomposition or by exposure to atmospheric oxygen. The preferred embodiment of this invention is to expose the epoxy substrate to atmospheric oxygen in combination with heating the substrate to a temperature between 50° C. and 60° C. Heat speeds up the transformation of the organopalladium salt to palladium metal.

As described above the substrate was exposed to the organopalladium vapor in a glass jar. The link connecting the solid organopalladium compound to the chamber holding the substrate is then closed. By means of a stopcock on the glass jar, the organopalladium vapor is removed and atmospheric oxygen is pumped in to the glass jar. The substrate is then irradiated with a conventional infrared lamp to heat the substrate to a temperature less than the substrate transformation temperature but preferably in the range of 50° C. to 60° C. the substrate transformation temperature is defined herein as the temperature at which the substrate degrades or physically changes, for example the melting point of the substrate. It is of course understood that these temperatures are exemplary and not limiting. Any means for heating the substrate can be used.

After the palladium metal seed is deposited, a metal such as copper, cobalt, palladium, nickel, silver, and gold is plated onto the seed by methods of electroless deposition commonly known in the art.

Another technique for creating active chemical sites on the substrate surface is to expose the substrate to an oxygen plasma. The preferred embodiment for this is an oxygen plasma of power density 0.3 Watts per cm² and pressure 100 millitorr. It is of course understood that these conditions are exemplary and not limiting.

An epoxy substrate is an organic material. On exposure to an oxygen plasma active chemical sites are formed on the epoxy surface. These sites are a type of organic acid which can be represented by $RCO_2H$, where R represents an organic constituent of the epoxy. The $CO_2H$ constituent is acidic and chemically bound to the substrate surface. When a surface is sensitized this way and then exposed to a vapor of an organopalladium compound such as (cyclopentadienyl)(allyl)palladium, it is believed that one or both of the following chemical reactions occurs:

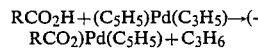

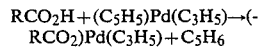

If the substrate is exposed to a vapor of bis(allyl)palladium the chemical reaction is the same except that the cyclopentadienyl ligand is replaced by an allyl ligand. The salt of the organopalladium compound is chemically bound to the substrate surface since the $CO_2H$ constituent is bound to the surface. The organopalladium salt is transformed into a palladium seed layer as described above.

Functional sites which interact with an organometallic vapor can be formed on substrates other than epoxy substrates. For example, silica gel has hydroxyl groups (OH) chemically bound to silicon atoms at the silica gel surface. These OH groups act as acidic functional sites with which vapors of organopalladium compounds can react to form the organometallic salt. Referring to the organic acid example above, the hydrogen atom of the hydroxyl group at the silica gel surface acts in the same way as the hydrogen atom of the organic acid. The palladium metal salt is chemically bound to the oxygen atom of the hydroxyl group and a free saturated organic ligand is formed. This salt is transformed into the palladium metal seed by the same methods described above.

While the invention has been described in terms of forming active chemical sites on silica gel and organic substrates, such as en epoxy, it will be recognized by those of ordinary skill in the art that active chemical sites, such as hydroxyl groups, can be formed on other substrate surfaces, such as semiconductors and ceramics.

It is believed that the ammonia plasma will form active chemical sites on the substrate surface by imparting nitrogen functionalities, predominantly NH— and $NH_2$—, on the substrate surface which are chemically, physically or by other means bound to the substrate surface. The substrate is exposed to a vapor of an organopalladium compound. The ammonia functionality at the surface may form a coordination complex with the palladium atom of the organopalladium compound. The palladium coordination complex adheres to the substrate surface since the ammonia ion does. The coordination complex is then transformed to palladium metal of the zero oxidation state by chemical reduction, thermal decomposition, exposure to atmospheric oxygen or exposure to atmospheric oxygen with the substrate at an elevated temperature. A metal, such as copper, is then plated onto the palladium metal seed by conventional electroless plating techniques.

Figure 2:
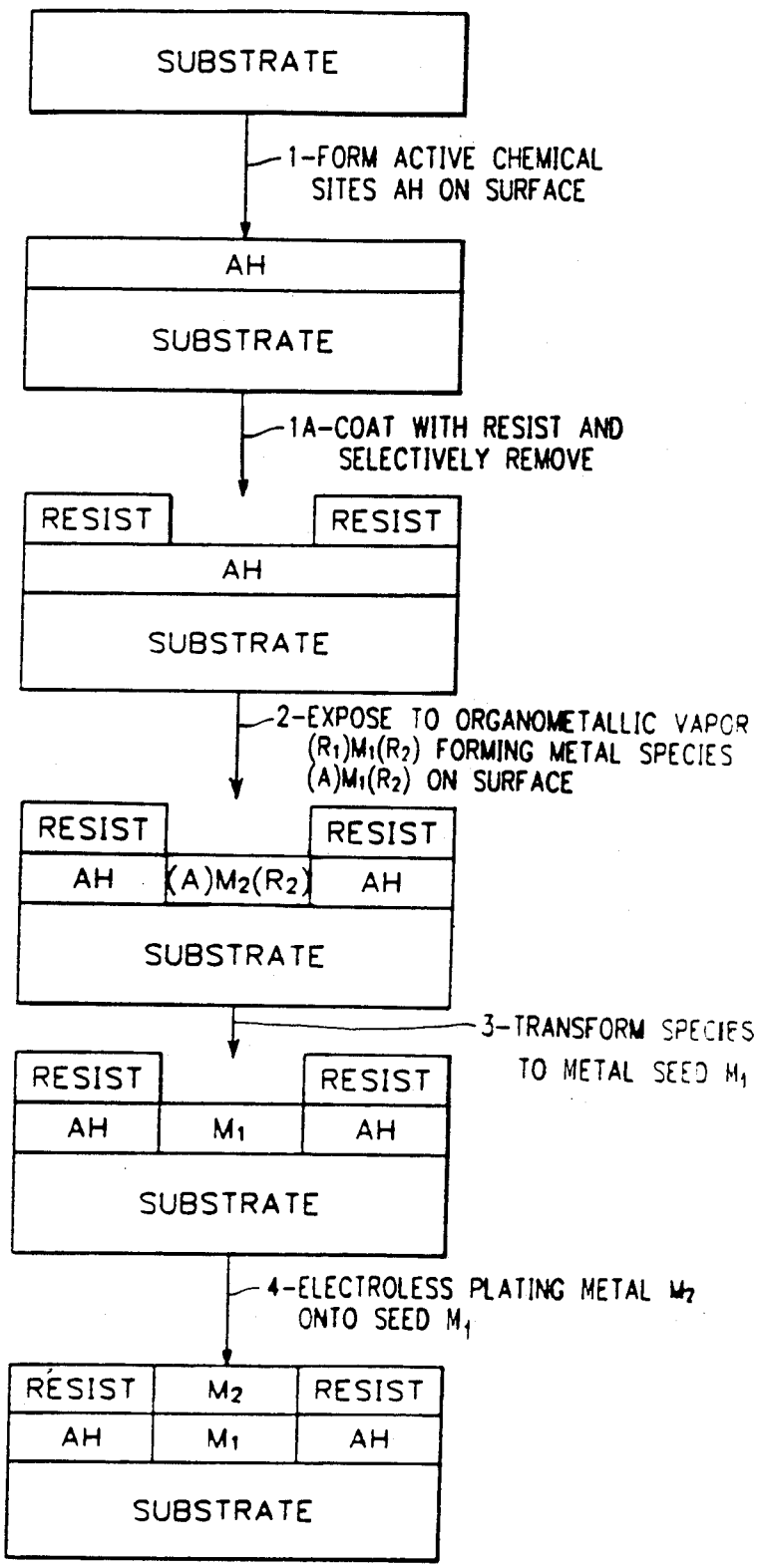
FIG. 2 is a flow chart similar to that of FIG. 1, except that the substrate is metallized only in selected areas.

FIG. 2 diagrammatically outlines one particular preferred variation of the present invention. Steps 1, 2, 3 and 4 are the same as in FIG. 1. The symbols used in FIG. 1 and FIG. 2 have the same meanings. FIG. 2 has the additional step 1A which includes coating the substrate with a resist type material, such as a photoresist or polymer, after it is sensitized with active chemical sites. The resist is selectively removed by means commonly known in the art. Thus, only selected regions or parts of the sensitized substrate are exposed. When the substrate is exposed to the vapor of the organometallic compound, in particular organopalladium compounds, deposition of the salt of the organometallic compound occurs only on the exposed regions. For this purpose, a resist type material which does not have active chemical sites, such as acid functionals, must be used if the resist is to remain as a permanent dielectric layer on the substrate. When the salt of the organopalladium compound is transformed into palladim metal seed, the seed adheres to those regions of the substrate selectively exposed to the organometallic vapor. A metal such as copper is then electrolessly plated by conventional means onto the palladium metal seed forming metal lines on the substrate surface. Since palladium metal seed is deposited neither onto the resist nor under the resist there is no undesired resistive path between the copper metal lines. The resist remaining acts as a dielectric between the deposited copper metal lines.

The resist used to create the copper metal line pattern does not have to be left as a permanent resist. After electroless deposition of a metal, such as copper, onto the selectively deposited palladium seed, the resist can be removed by methods commonly known in the art.

When a nonpermanent resist is used, the resist can be removed prior to the electroless deposition of copper. Plating with the resist pattern on the substrate results in better quality rectangular shaped metal lines. After resist removal, a palladium metal seed pattern is left on the substrate onto which the copper can be electrolessly plated. In this case the resist material could have acid functional groups. Palladium metal would be formed on the resist. However, this would not create any undesired effects since, when the resist is removed, the palladium metal on it would also be removed. Reston (registered Trademark of E. I. duPont de Nemours & Company) photoresist is an example of a resist with substantial chromic moiety. After removal of the Riston deposied on a substrate there is sufficient acid functionality on the substrate for effective chemical reaction with an organometallic vapor. Using this resist, a substrate surface does not have to be further sensitized with acid functionals in a separate step prior to deposition of the resist.

It is to be understood that the above described embodiments are simply illustrative of the principles of the invention. Various other modifications and changes may be devised by those skilled in the art which will embody the principles of the invention and fall within the spirit and scope thereof.

Having thus described our invention, what we claim as new and desire to secure by Letters Patent is:

1. A method for preparing a substrate surface for subsequent metallization comprising the steps of:
    forming active chemical sites adherent to the substrate surface, said active chemical sites having the property of being capable of chemically reacting with a volatile organometallic compound exposed to said sites;
    contacting a portion of said substrate surface with a vapor of said volatile organometallic compound for a time sufficient for said active sites to chemically react with said volatile organometallic compound, the chemical reaction releasing a saturated organic ligand from said organometallic compound and the chemical reaction forming a second compound, which is a species of said organometallic compound, from said active site and the remainder of said organometallic compound, said second compound adheres to said substrate surface, said second compound contains the metal constituent of said volatile organometallic compound;
    transforming said second compound to said constituent metal adhering to said substrate surface;
    said constituent metal of said organometallic compound is palladium; and
    depositing copper by electroless deposition on those areas of said substrate to which said palladium adheres.

2. A method for preparing a substrate surface for subsequent metallization comprising the steps of:
    forming active chemical sites adherent to the substrate surface, said active chemical sites having the property of being capable of chemically reacting with a volatile organometallic compound exposed to said sites;
    contacting a portion of said substrate surface with a vapor of said volatile organometallic compound for a time sufficient for said active sites to chemically react with said volatile organometallic compound, the chemical reaction releasing a saturated organic ligand from said organometallic compound and the chemical reaction forming a second compound, which is a species of said organometallic compound, from said active site and the remainder of said organomettallic compound, said second compound adheres to said substrate surface, said second compound contains the metal constituent of said volatile organometallic compound;
    transforming said second compound to said constituent metal adhering to the substrate surface; and
    electrolessly depositing a metal on those areas of said substrate to which said constituent metal adheres.

3. A method for preparing a substrate surface for subsequent metallization comprising the steps of:
    forming active chemical sites adherent to the substrate surface, said active chemical sites having the property of being capable of chemically reacting with a volatile organometallic compound exposed to said sites;
    contacting a portion of said substrate surface with a vapor of said volatile organometallic compound for a time sufficient for said active sites to chemically react with said volatile organometallic compound, the chemical reaction releasing a saturated organic ligand from which is a species of said organometallic compound, from said active site and the remainder of said organometallic compound, said second compound adheres to said substrate surface, said second compound contains the metal constituent of said volatile organometallic compound;

said species is said constituent metal;

electrolessly depositing a metal onto those areas of said substrate to which said constituent metal adheres.

4. A method for preparing a substrate surface for subsequent metallization comprising the steps of:

forming active chemical sites adherent to the substrate surface, said active chemical sites having the property of being capable of chemically reacting with a volatile organometallic compound exposed to said sites;

contacting a portion of said substrate surface with a vapor of said volatile organometallic compound for a time sufficient for said active sites to chemically react with said volatile organometallic compound, the chemical reaction releasing a saturated organic ligand from said organometallic compound and the chemical reaction forming a second compound, which is a species of said organometallic compound, from said active site and the remainder of said organometallic compound, said second compound adheres to said substrate surface, said second compound contains the metal constituent of said volatile organometallic compound; and said constituent metal of said organometallic compound is palladium.

5. A method for preparing a substrate surface for subsequent metallization comprising the steps of:

forming active chemical sites adherent to the substrate surface, said active chemical sites having the property of being capable of chemically reacting with a volatile organometallic compound exposed to said sites;

contacting a portion of said substrate surface with a vapor of said volatile organometallic compound for a time sufficient for said active sites to chemically react with said volatile organometallic compound, the chemical reaction releasing a saturated organic ligand from said organometallic compound and the chemical reaction forming a second compound, which is a species of said organometallic compound, from said active site and the remainder of said organometallic compound, said second compound adheres to said substrate surface, said second compound contains the metal constituent of said volatile organometallic compound;

said species is said constituent metal;

said substrate is an epoxy.

6. The method of claim 5 wherein the constituent metal of said organometallic compound is palladium and said electrolessly deposited metal is copper.

7. The method of clain 2 wherein the electrolessly deposited metal is copper.

8. The method of claim 2 is wherein the electrolessly deposited metal is selected from the group consisting of copper, cobalt, palladium, nickel, silver and gold.

9. A method for preparing a substrate surface for subsequent metallization comprising the steps of:

forming active chemical sites adherent to the substrate surface, said active chemical sites having the property of being capable of chemically reacting with a volatile organometallic compound exposed to said sites;

contacting a portion of said substrate surface with a vapor of said volatile organometallic compound for a time sufficient for said active sites to chemically react with said volatile organometallic compound, the chemical reaaction releasing a saturated organic ligand from said organometallic compound and the chemical reaction forming a second compound, which is a species of said organometallic compound, from said active site and the remainder of said organometallic compound, said second compound adheres to said substrate surface, said second compound contains the metal constituent of said volatile organometallic compound; and said constituent metal of said organometallic compound is selected from the group consisting of nickel, copper and palladium.

10. A method for preparing a substrate surface for subsequent metallization comprising the steps of:

forming active chemical sites adherent to the substrate surface, said active chemical sites having the property of being capable of chemically reacting with a volatile organometallic compound exposed to said sites;

contacting a portion of said substrate surface with a vapor of said volatile organometallic compound for a time sufficient for said active sites to chemically react with said volatile organometallic compound, the chemical reaction releasing a saturated organic ligand from said organometallic compound and the chemical reaction forming a second compound, which is a species of said organometallic compound, from said active site and the remainder of said organometallic compound, said second compound adheres to said substrate surface, said second compound contains the metal constituent of said volatile organometallic compound; and said organometallic compound is selected from the group consisting of a (cyclopentadienyl)(allyl)palladium(II) compound and a bis(allyl)palladium(II) compound.

11. A method for preparing a substrate surface for subsequent metallization comprising the steps of:

forming active chemical sites adherent to the substrate surface, said active chemical sites having the property of being capable of chemically reacting with a volatile organometallic compound exposed to said sites;

contacting a portion of said substrate surface with a vapor of said volatile organometallic compound for a time sufficient for said active sites to chemically react with said volatile organometallic compound, the chemical reaction releasing a saturated organic ligand from said organometallic compound and the chemical reaction forming a second compound, which is a species of said organometallic compound, from said active site and the remainder of said organometallic compound, said second compound adheres to said substrate surface, said second compound contains the metal constituent of said volatile organometallic compound; and said organometallic compound is selected from the group constiting of a (cyclopentadienyl)(allyl)palladium(II) compound, a bis(allyl)palladium(II) compound, a nickel carbonyl compound, a diallynickel(II) compound and a (cyclopentadienyl)(triethylphosphine)copper I compound.

12. A method for preparing a substrate surface for subsequent metallization comprising the steps of:
forming active chemical sites adherent to the substrate surface, said active chemical sites having the property of being capable of chemically reacting with a volatile organometallic compound exposed to said sites;
contacting a portion of said substrate surface with a vapor of said volatile organometallic compound for a time sufficient for said active sites to chemically react with said volatile organometallic compound, the chemical reaction releasing a saturated organic ligand from said organometallic compound and the chemical reaction forming a second compound, which is a species of said organometallic compound, from said active site and the remainder of said organometallic compound, said second compound adheres to said substrate surface, said second compound contains the metal constituent of said volatile organometallic compound;
transforming said second compound to said constituent metal adhering to the substrate surface; and
wherein said step of contacting a portion of the substrate surface includes th steps of, prior to contacting the substrate surface with the organometallic vapor, covering the substrate with a resist-type material and selectively removing said resist material.

13. A method for preparing a substrate surface for subsequent metallization comprising the steps of:
forming active chemical sites adherent to the substrate surface, said active chemical sites having the property of being capable of chemically reacting with a volatile organometallic compound exposed to said sites;
contacting a portion of said substrate surface with a vapor of said volatile organometallic compound for a time sufficient for said active sites to chemically react with said volatile organometallic compound, the chemical reaction releasing a saturated organic ligand from said organometallic compound and the chemical reaction forming a second compound, which is a species of said organometallic compound, from said active site and the remainder of said organometallic compound, said second compound adheres to said substrate surface, said second compound contains the metal constituent of said volatile organometallic compound; and
wherein said substrate is selected from the group consisting of polymers, epoxies, semiconductors and ceramics.

14. A method for preparing a substrate surface for subsequent metallization comprising the steps of:
forming active chemical sites adherent to the substrate surface, said active chemical sites being capable of chemically reacting with a volatile organometallic compound exposed to said sites;
covering said substrate with a resist type material;
selectively removing said resist-type material to expose a portion of said substrate surface;
contacting said active chemical sites in said exposed portion of said substrate surface with a vapor of said volatile organometallic compound for a time sufficient for said active sites to chemically react with said volatile organometallic compound, the chemical reaction releasing a saturated organic ligand from said organometallic compound and the chemical reaction forming a second compound, which is a species of said organometallic compound, from said active site and the remainder of said organometallic compound, said second compound adheres to said substrate surface, said second compound contains the metal constituent of said volatile organometallic compound;
transforming said second compound to the constituent metal as a seed adhering to the substrate surface; and
depositing a metal by electroless deposition on those areas of said substrate to which seed adheres.

15. The method claim 14 wherein the constituent metal of said organometallic compound is selected from the group consisting of palladium, nickel and copper.

16. The method of claim 14 wherein the constituent metal of said organometallic compound is palladium.

17. The method claim 16 wherein the electrolessly deposited metal is selected from the group consisting of copper, cobalt, palladium, nickel, silver and gold.

18. The method of claim 14 wherein said electrolessly deposited metal is copper and said constituent metal of said organometallic compound is palladium.

19. The method of claim 16 wherein said substrate is an epoxy.

20. The method of claim 18 wherein said substrate is an epoxy.

21. A method for preparing a substrate surface for subsequent metallization comprising the steps of:
forming active chemical sites adherent to the substrate surface, said active chemical sites having the property of being capable of chemically reacting with a volatile palladium compound exposed to said sites; and
contacting a portion of said substrate surface with a vapor of said volatile palladium compound for a time sufficient for said active sites to chemically react with said volatile organopalladium compound, the chemical reaction releasing a saturated organic ligand from said organopalladium compound and the chemical reaction forming a second compound, which is a species of said organopalladium compound, from said active site and the remainder of said organopalladium compound, said second compound adheres to said substrate surface, said second compound contains the metal constituent of said volatile organopalladium compound.

22. A method for preparing a substrate surface for subsequent metallization comprising the steps of:
forming active chemical sites adherent to the substrate surface, said active chemical sites being selected from the group consisting of acidic sites and ammonia functionals, said active chemical sites having the property of being capable of chemically reacting with a volatile organopalladium compound exposed to said sites, said organopalladium compound being selected from the group consisting of a (cyclopentadienyl)(allyl)palladium (II) compound and a bis(allyl)palladium (II) compound; and
contacting a portion of said substrate surface with a vapor of said volatile organopalladium compound for a time sufficient for said active sites to chemically react with said volatile oreganopalladium compound, the chemical reaction releasing a saturated organic ligand from said organopalladium compound and the chemical reaction forming a second compound, which is a species of said organopalladium compound, from said active site and the remainder of said organopalladium compound, said second compound adheres to said substrate surface, said second compound contains the metal constituent of said volatile organopalladium compound.

23. A method for preparing an epoxy substrate surface for subsequent metallization comprising the steps of:

forming active chemical sites adherent to the substrate surface, said active chemical sites having the property of being capable of chemically reacting with a volatile organopalladium compound exposed to said sites, said organopalladium compound being selected from the group consisting of a (cyclopentadienyl)(allyl)palladium (II) compound and a bis(allyl)palladium (II) compound; and contacting a portion of said substrate surface with a vapor of said volatile organopalladium compound for a time sufficient for said active sites to chemically react with said volatile organopalladium compound, the chemical reaction releasing a saturated organic ligand from said organopalladium compound and the chemical reaction forming a second compound, which is a species of said organopalladium compound, from said active site and the remainder of said organopalladium compound, said second compound adheres to said substrate surface, said second compound contains the metal constituent of said volatile organopalladium compound.

* * * * *